(12) United States Patent
Ishibashi

(10) Patent No.: US 7,426,224 B2
(45) Date of Patent: Sep. 16, 2008

(54) OPTICAL TRANSMITTER WITH A DIGITALLY CONTROLLED BIAS AND MODULATION CURRENTS FOR A LASER DIODE

(75) Inventor: Hiroto Ishibashi, Yokohama (JP)

(73) Assignee: Sumitomo Electronic Industries, Ltd., Osaka (JP)

( * ) Notice: Subject to any disclaimer, the term of this patent is extended or adjusted under 35 U.S.C. 154(b) by 0 days.

(21) Appl. No.: 11/790,073

(22) Filed: Apr. 23, 2007

(65) Prior Publication Data
US 2007/0248130 A1 Oct. 25, 2007

(30) Foreign Application Priority Data
Apr. 25, 2006 (JP) ............................. 2006-120862

(51) Int. Cl.
*H01S 3/13* (2006.01)
*H01S 3/00* (2006.01)

(52) U.S. Cl. ................... 372/29.01; 372/38.02

(58) Field of Classification Search ............. 372/29.01, 372/29.011, 29.014, 29.015, 38.1, 38.01, 372/38.02, 38.07
See application file for complete search history.

(56) References Cited

U.S. PATENT DOCUMENTS

| 6,885,685 B2* | 4/2005 | Hidaka et al. ............ 372/38.02 |
| 7,106,768 B2 | 9/2006 | Murata |

FOREIGN PATENT DOCUMENTS

JP 2000-022631 1/2000

* cited by examiner

*Primary Examiner*—Armando Rodriguez
(74) *Attorney, Agent, or Firm*—Smith, Gambrell & Russell, LLP

(57) ABSTRACT

The present invention is to provide an optical transmitter that installs a laser diode and a circuit to control currents supplied to the laser diode, and reduces the size of the control circuit. The transmitter includes an LD, an LD-Driver, a monitor PD, and a control unit that outputs two data for the bias and modulation currents to the driver based on the photocurrent. The control unit provides a memory whose addresses correspond to the bias current, while a data for the modulation current is set within an address of the memory. Accordingly, the control unit adjusts the bias current so as to maintain the photocurrent constant and outputs the data for the modulation current to the driver by reading information stored in the address corresponding to the bias current.

3 Claims, 4 Drawing Sheets

US 7,426,224 B2

OPTICAL TRANSMITTER WITH A DIGITALLY CONTROLLED BIAS AND MODULATION CURRENTS FOR A LASER DIODE

BACKGROUND OF THE INVENTION

1. Field of the Invention

The present invention relates to an optical transmitter, in particular, the invention relates to an optical transmitter that installed within an optical data link for the optical communication and installs a semiconductor laser diode digitally controlled in the bias and modulation current supplied thereto.

2. Related Prior Art

Various techniques and circuits have been disclosed to control the optical output from the laser diode in the magnitude and the extinction ratio thereof. The United States Patent, U.S. Pat. No. 7,106,768, has disclosed a method to control the LD, where the controller reads from the memory a pair of data, one for the bias current and the other for the modulation current, and sets both currents based on thus read data.

The memory of the transmitter disclosed in the prior art above stores a set of combinations of the currents to obtain a desired optical power and an extinction ratio for the LD. Such combinations of the currents strongly depends on individual devices, accordingly, it is necessary to measure optimal combinations of the currents to maintain the desired optical power and the extinction ratio as varying a temperature of the LD and to store such combinations in the memory at the initial operation of the transmitter. Thus, a large size of the memory is necessary to enhance the preciseness of the control of the LD, which enlarges the circuit size and raises the cost of the transmitter.

The present invention, considering the subjects mentioned above, is to provide an optical transmitter where the size of the data stored in the memory may be saved and accordingly the physical size thereof may be reduced.

SUMMARY OF THE INVENTION

An aspect of the present invention relates to a configuration of the optical transmitter. The optical transmitter according to the invention includes a semiconductor laser diode (LD), a driver, a photodiode (PD), and a control unit. The LD outputs an optical signal with a predetermined magnitude and a predetermined extinction ration by receiving modulation and bias currents. The driver sets the modulation and bias currents to the LD by receiving one set of data each corresponding to bias and modulation currents, respectively. The PD monitors a portion of the optical signal output from the LD and generates a photocurrent. The control unit includes a current controller and a memory. The memory stores a plurality of data each corresponding to the modulation current in addresses in connection with the bias current. The current controller sets a first data for the bias current based on the photocurrent, sets a second data for the modulation current read from an address of the memory in connection with the first data and outputs the one set of data, which includes above first and second data, to the driver.

The memory of the present optical transmitter stores a set of second data for the modulation current. The current controller reads out one of second data from an address that relates to the bias current determined so as to maintain the photocurrent constant, where the combination of the first and second data has the optical output of the LD to show the predetermined magnitude and the predetermined extinction ratio. Thus, the memory only stores one of set of data for the bias current or for the modulation current, which makes the size of the circuit compact in physical and electrical.

Another aspect of the present invention relates to a method for controlling an optical transmitter that provides an LD, a PD, a driver and a control unit. The method comprises steps of: (a) monitoring the photocurrent by the control unit; (b) setting a first data for the bias current so as to maintain the monitored signal output from the PD constant; (c) setting a second data for he modulation current from an address in connection with the first data for the bias current; (d) providing a set of data including first and second data to the driver from the control unit, and (e) providing the bias current and the modulation current each determined by the first and second data, respectively, to the LD.

DESCRIPTION OF PREFERRED EMBODIMENTS

Next, preferred embodiments according to the present invention will be described as referring to accompanying drawings. In the description, the same numerals or the symbols will refer to the same elements without overlapping explanations.

First Embodiment

Figure 1:
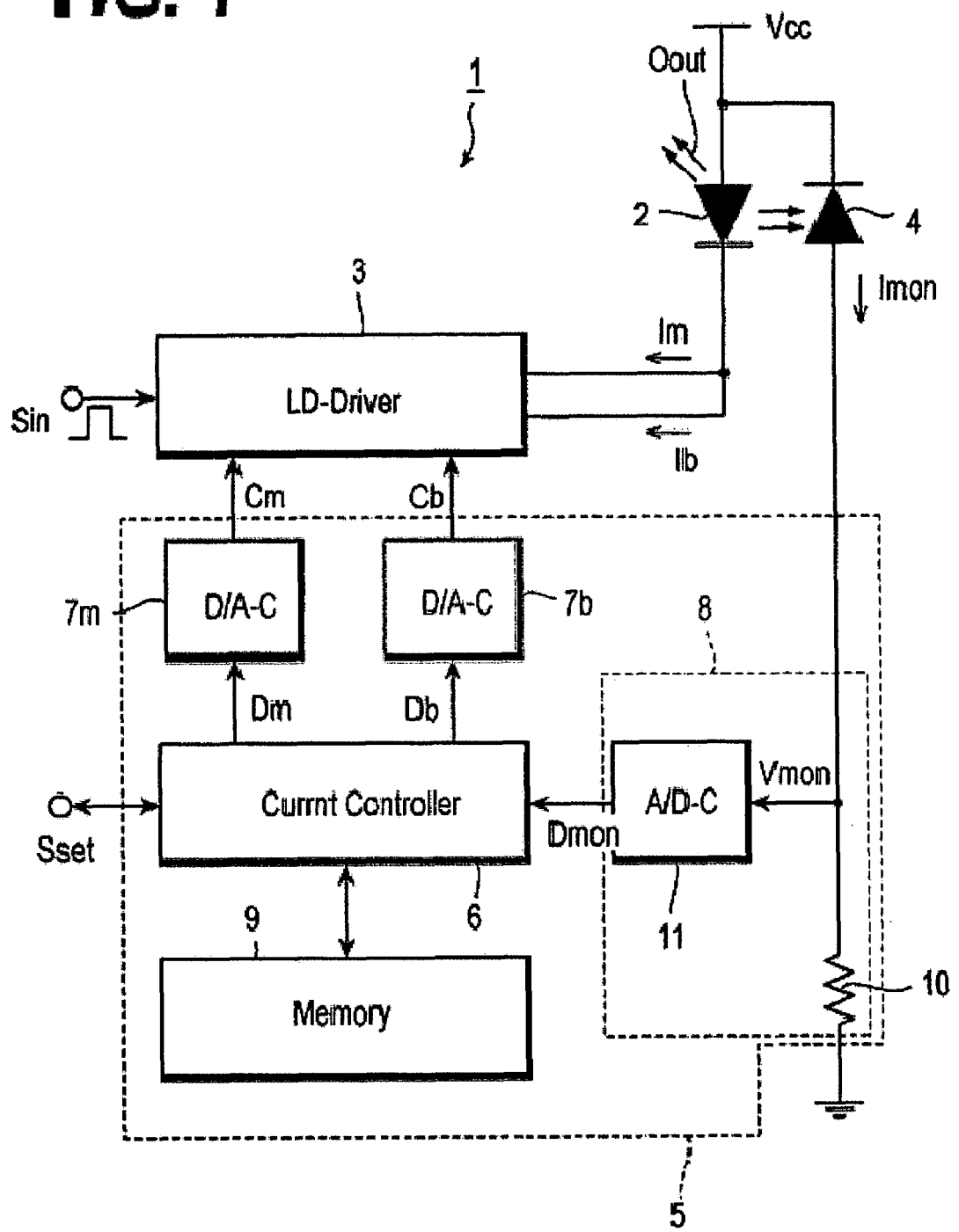
FIG. 1 is a block diagram showing an optical transmitter according to a first embodiment of the present invention.

FIG. 1 is a block diagram of an optical transmitter 1 according to an embodiment of the present invention. The optical transmitter 1 is applicable to an optical data link and includes a laser diode (LD) 2 to output an optical signal Oout, an LD-Driver 3 to supply currents to the LD 2, a photodiode (PD) 4 to monitor a portion of the optical signal Oout, and a control unit 5 to adjust the current supplied to the LD-Driver 3.

The LD 2 is, in the anode electrode thereof, connected with a power supply Vcc, while, in the cathode thereof, connected with output terminals of the LD-Driver 3. The LD-Driver 3, depending on control signals, Cm and Cb, provides the modulation current Im and the bias current Ib to the LD 2. The LD-Driver 3 modulates the modulation current Im by the input signal Sin, which is input thereto.

The cathode of the PD 4 is also connected to the power supply Vcc. The PD, by receiving a portion of the optical output Oout, generates a photocurrent Imon.

The control unit 5 includes a current controller 6, two digital-to-analog converters (D/A-C), 7m and 7b, a monitor unit 8 to monitor the photocurrent Imon, and a memory 9 coupled with the current controller 6.

The monitor unit 8 includes a resistor 10 and an analog-to-digital converter (A/D-C) 11. The resistor 10, connected to the anode of the PD 4, converts the photocurrent Imon into a corresponding voltage signal Vmon. The A/D-C 11, also connected to the anode of the PD 4, converts the voltage signal Vmon to a digital signal Dmon.

The current controller 6, constituted with, for example, a central processing unit (CPU) and other digital circuits, sets the control signals, Dm and Db, based on the input digital signal Dmon to respective D/A-Cs, 7m and 7b.

Specifically, the current controller 6 is configured to compare the input digital signal Dmon with a preset signal Sset, to vary the signal Db by a predetermined step ΔSb so as to minimize a difference of the signal Dmon from the preset signal, and to set the signal Dm by accessing an address of the memory 9 that corresponds to the digital signal Db and reading information stored therein.

Table I below shows an architecture of the memory 9 to determine the modulation current Dm. The address "index+ 0" of the memory 9, which corresponds to the minimum value of the bias current, Dbmin, stores a data Dm0 for the modulation current that reflects the value Dbmin. The address "index+1", which corresponds to the bias current Dbmin+ ΔS$_b$, stores a data Dm1, which is connected to the bias current Dbmin+ΔS$_b$. Thus, a plurality of bias currents from the minimum, Dbmin, to the maximum, Dbmax, with the interval ΔSb are reflected in the addresses of the memory 9, and an address "index+(I−1)", which corresponds to a bias current Dbmin+ (I−1)×ΔSb, stores a data Dm(I) for the modulation current. The current controller 6, by accessing the memory 9, sets one combination of the bias current, Dbmin+(I−1)×ΔSb and the paired modulation current Dm(I).

TABLE I

Memory Configuration

| Address | Data |
|---|---|
| Index + 0 | Dm0 |
| Index + 1 | Dm1 |
| ... | ... |
| Index + n | Dmn |

Referring to FIG. 1 again, two D/A-Cs, 7m and 7b, convert the control signals, Dm and Db, output from the current controller 6 into respective analog signals, Cm and Cb, and provides then to the LD-Driver 3.

Next, a method to set the table I in the memory 9 will be described.

First, a combination of data {Dm, Db} (i) is selected such that the optical output Oout shows preset magnitude and extinction ratio by monitoring the photocurrent Imon at an initializing routine for the transmitter 1 where the current controller 6 is in standstill and an ambient temperature is kept constant. Subsequently, a plurality of combinations {Dm, Db} (i=1, . . . , m) is determined as varying the ambient temperature. For each combination {Dm, Db} (k) at a temperature Tk, the optical output Oout shows the preset magnitude and the present extinction ratio. An optimal combination of data {Dm, Db} may solely depend on the temperature, that is, only one data Dm for the modulation current is combined with one data Db for the bias current to show the preset magnitude and the preset extinction ratio, no plural data Dm may be combined with the target data Db for the bias current.

Next, a set of combinations {Dm, Db} (j=1, . . . , n), where the data Db for the bias current varies by the interval ΔSb between the minimum, Dbmin, and the maximum, Dbmax, is selected from the combinations {Dm, Db} (i=1, . . . , m), where the data Db optionally varies depending on the temperature. That is, a condition j=1 corresponds to a combination {Dm1, Dbmin} (j=1), j=2 corresponds to a combination {Dm2, Dbmin+ΔSb} (j=2), and so on. Table II below shows an example of thus constructed table {Dm, Db} (j=1, . . . , n). In the table, Db0 is equal to Dbmin, Db1 is equal to Dbmin+ ΔSb, and Dbn is equal to Dbmax.

TABLE II

Reference Table

| Entry Number | Data for Bias Current | Data for Modulation Current |
|---|---|---|
| 0 | Dbmin | Dm0 |
| 1 | Dbmin + ΔSb | Dm1 |
| 2 | Dbmin + 2 × ΔSb | Dm2 |
| ... | ... | ... |
| n | Dbmax | Dmn |

Next, the index address of the memory 9 is set, into which the data Dm0 corresponding to the data Dbmin for the bias current is stored. Subsequently, a set of data Dm1, Dm2, . . . , and Dmn for the modulation current is set within the memory as increasing the address thereof by one from the index address.

Thus, in the optical transmitter 1, the memory 9 only stores the set of control data Dm for the modulation current in connection with the bias current Db but the data Db is reflected in the address of the memory 9. The current controller 6 only adjusts the data Db for the bias current based on the photocurrent Imon, and reads the data Dm from the memory corresponding to the data Db.

Accordingly, the space in the memory 9 for the data Db may become unnecessary, which makes the circuit of the control unit small. A table III below shows a conventional configuration of the memory to store both sets for the bias current Db and the modulation current Dm. As acknowledged from the table III, the size of the memory 9 of the present invention may become half of the conventional one where the memory is necessary to store the set of the combinations {Dm, Db}.

TABLE III

Conventional Configuration

| Address | Data |
|---|---|
| Index + 0 | Db0 |
| Index + 1 | Dm0 |
| Index + 2 | Db1 |
| Index + 3 | Dm1 |
| ... | ... |
| Index + 2n | Dbn |
| Index + 2n + 1 | Dmn |

Moreover, because the feedback loop including the current controller 6, the LD-Driver 3, the LD 2 and the PD 4 only adjusts the bias current Ib, while the modulation current Im is automatically selected from the memory 9, the time constant of thus feedback loop may be shortened, which stabilizes the optical output Oout instantaneously.

Second Embodiment

Figure 2:
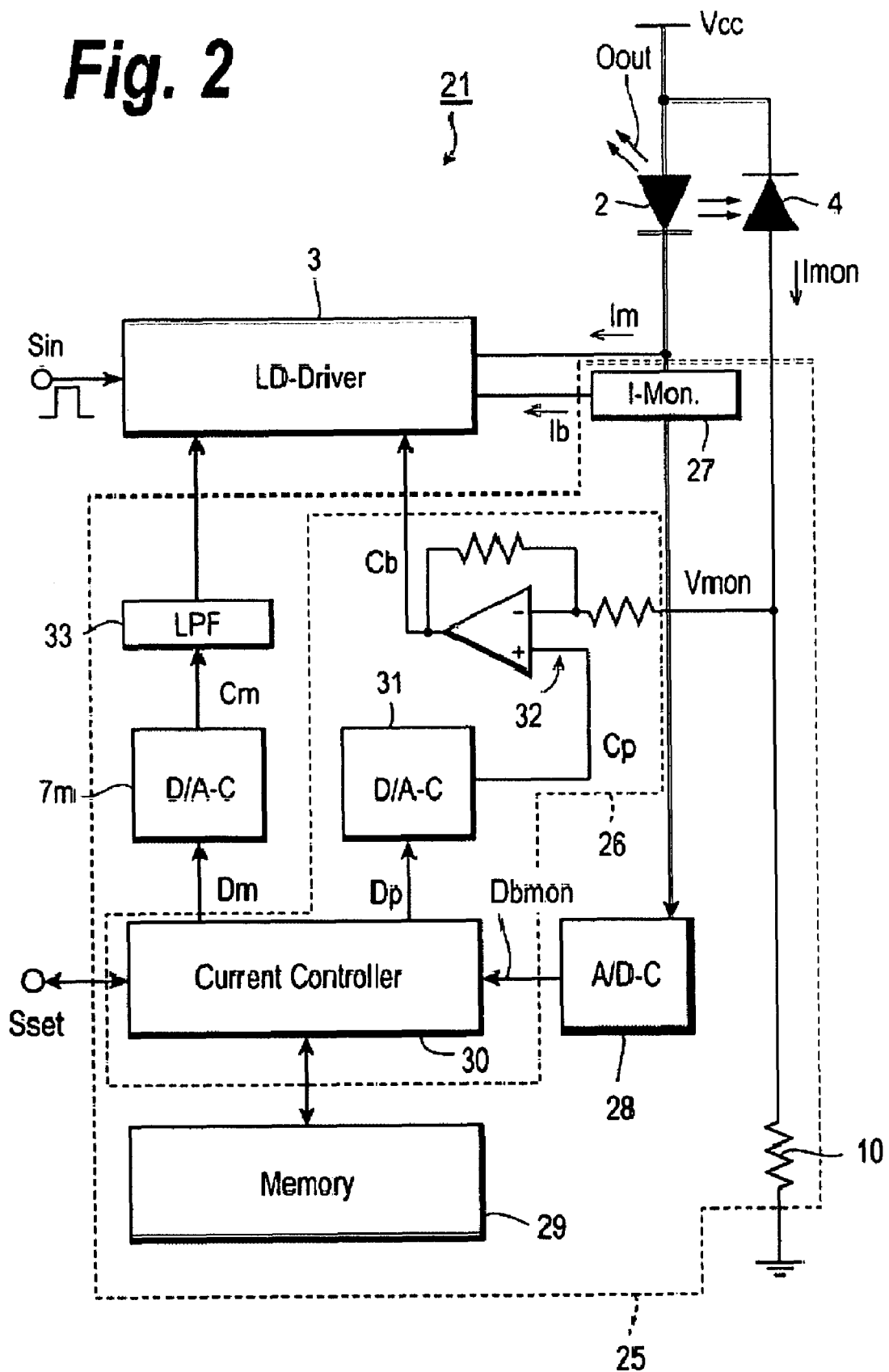
FIG. 2 is another block diagram of an optical transmitter according to a second embodiment of the inventions.

Next, the second embodiment of the present invention will be described. FIG. 2 shows a block diagram of an optical transmitter 21 according to the second embodiment of the present invention. The optical transmitter 21 has a different configuration from the former transmitter 1 in a point that the control unit 25 constitutes a block to control the bias current in analog.

Specifically, the control unit 25 includes a current controller 30, a D/A-C 31, a circuit 26 to control the bias current Ib, a current monitor circuit 27 and an A/D-C 28. The D/A-C 31 converts the data Dp output from the current controller 30 into an analog signal Cp and provides this analog signal Cp in the analog control unit 32 for the bias current Ib.

The analog control unit 32, which includes two resistors and a differential circuit, receives a monitored signal Vmon converted from the photocurrent Imon by the resistor 10. The analog control unit 32 generates a control signal Cb, by comparing the signal Cp with the monitored signal Vmon, such that the monitored signal Vmon becomes equal to the control signal Cb by providing the output Cb to the LD-Driver 3.

The current monitor unit 27, by monitoring the bias current Ib output from the LD-Driver 3, provides the monitored result to the A/D-C 28, and the A/b-C 28 converts this monitored result into a digital data Dbmon.

The control unit 30 generates a data Dp such that the magnitude of the optical output Oout becomes a preset value based on data stored in the memory 29. Further, the current controller 30 is configured to determine the data Cb based on the data Dbmon output from the A/D-C 28 and to periodically read the data Dm from the address of the memory 29 that reflects the data Cb. Thus, the current controller 30 periodically adjusts the magnitude of the modulation current Im.

The memory 29, same as that shown in Table I, stores a set of data (Dm0, . . . , Dmn) in addresses (index+0, index+1, . . . , index+n) each corresponding to the set of data from the minimum, Dbim, to the maximum, Dbmax, with a preset interval $\Delta Sb$ of the monitored signal Dbmon. Thus, the current controller 30 may determine the control data Dm for the modulation current corresponding to the monitored data Dbmon for the bias current.

The control unit 25 shown in FIG. 2 further provides a low-pass-filter (LPF) 33 between the D/A-C 7m and the LD-Driver 3. The time constant of this filter 33 is preferably set to be large enough to escape the feedback loop from being unstable and, at the same time, to satisfy a request for the response time from the DISABLE mode to the ENABLE mode of the transmitter 1, where the DISABLE mode prevents the operation of the LD by the external command while the ENABLE mode enables to operate the LD by the external command.

The preset table for the modulation current in the memory 29 is constructed as follows:

First, the current controller 30 outputs the data Db such that the magnitude of the optical output Oout becomes the preset value at a temperature while the APC loop is suspended. Under the condition above, the data Dm is set, by monitoring the photocurrent Imon, such that the optical output Oout shows the preset extinction ratio. An optimal combination of data {Dm, Dbmon} corresponding to the modulation and bias currents may be thus determined.

Next, a set of optimal combination {Dm, Dbmon} (i=1, . . . , m) is determined as varying the ambient temperature, and combinations {Dm, Dbmon} (j=1, . . . , n) are selected among the combinations {Dm, Dbmon} (i=1, . . . , m) such that the data Dbmon changes from the minimum, Dmin, to the maximum, Dbmax, with the preset interval, $\Delta Sb$.

The indexed address of the memory 29, which corresponds to the minimum, Dbmin, for the monitored signal, is decided and the data Dm0 for the modulation current is stored therein. Subsequently, the other data Dm1, Dm2, . . . , Dmn for the modulation current are set in the memory as increasing the address of the memory 29 by one.

The optical transmitter 21 may also save the size of the memory 29 to control the bias and modulation currents such that the optical output Oout shows the preset magnitude and the extinction ration, and may also make the control of the magnitude and the extinction ratio prompt. Moreover, the transmitter 21 shown in FIG. 2 relaxes the throughput of the current controller 30, because the control unit for the bias current Ib is configured in analog. Still further, the transmitter 21 effectively prevents an excess current from being provided in the LD 2 because of the low-pass-filter between the current controller 30 and the LD-Driver 3.

Generally, the LD-Driver shows a response so prompt to immediately follow the change of the data, Cm or Cb, from the control unit. For instance, the LD-Driver 3 for the transmission signal faster than 1 Gbps generally has a response time of several nano-seconds to several-tenth nano-seconds, which is far faster than the response of the APC circuit, typically from several micro-seconds to several-tenth micro-seconds. For such LD-Driver, when the power supply is powered on or the operation changes from the DISABLE mode to the ENABLE mode, the bias current Ib first transitions to $I_{BT}+0.5\times I_{MT}$, where $I_{BT}$ and $I_{MT}$ are the target currents for the bias and modulations current, respectively, and the modulation current starts to flow with a delay by the process carried out in the control unit. Thus, the driving current shows an overshoot at the beginning of the operation, which becomes an excess current flowing in the LD.

Figure 3:
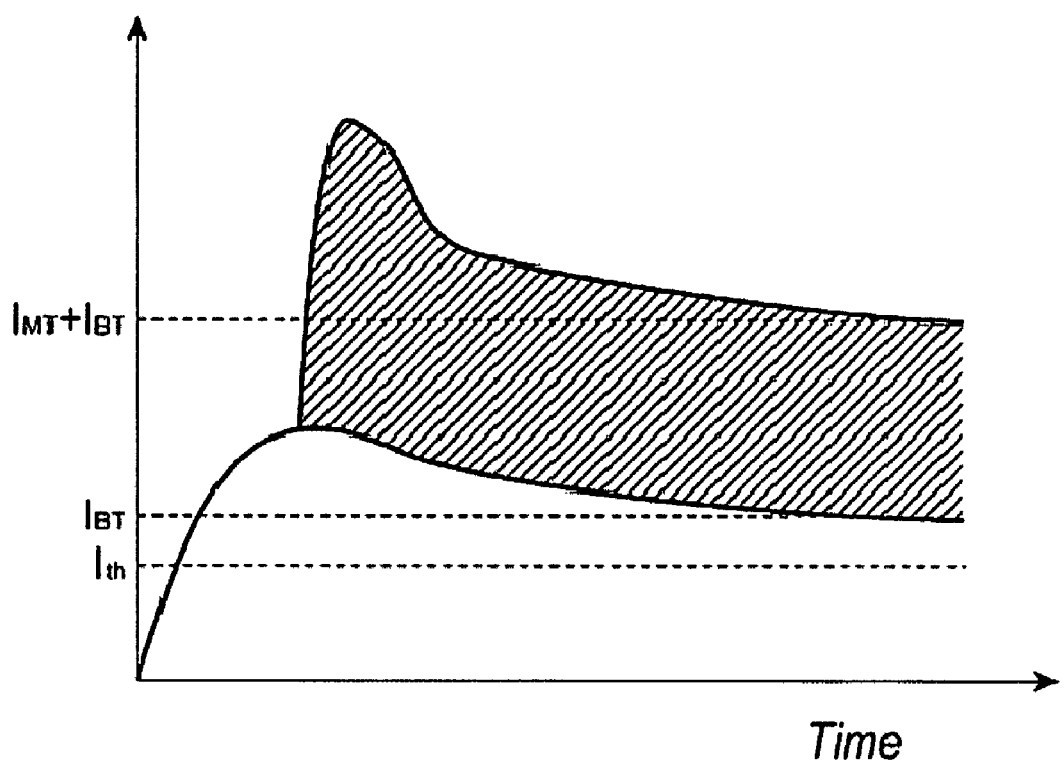
FIG. 3 shows a response of the driving current for the LD without a low-pass-filter between the driver and the control unit.

When the modulation current Im does not start to flow, the bias current Ib operates so as to converge to a value greater than the target value $I_{BT}$ and the modulation current Im is set by referring this miss-converged bias current. Moreover, a digital processing unit installed within an optical transmitter is often restricted in its throughput such that a cycle time thereof is several hundred micro-seconds at most, the process to determine the modulation current Im refers past bias current. Thus, the driving current shows the overshoot as shown in FIG. 3.

Figure 4:
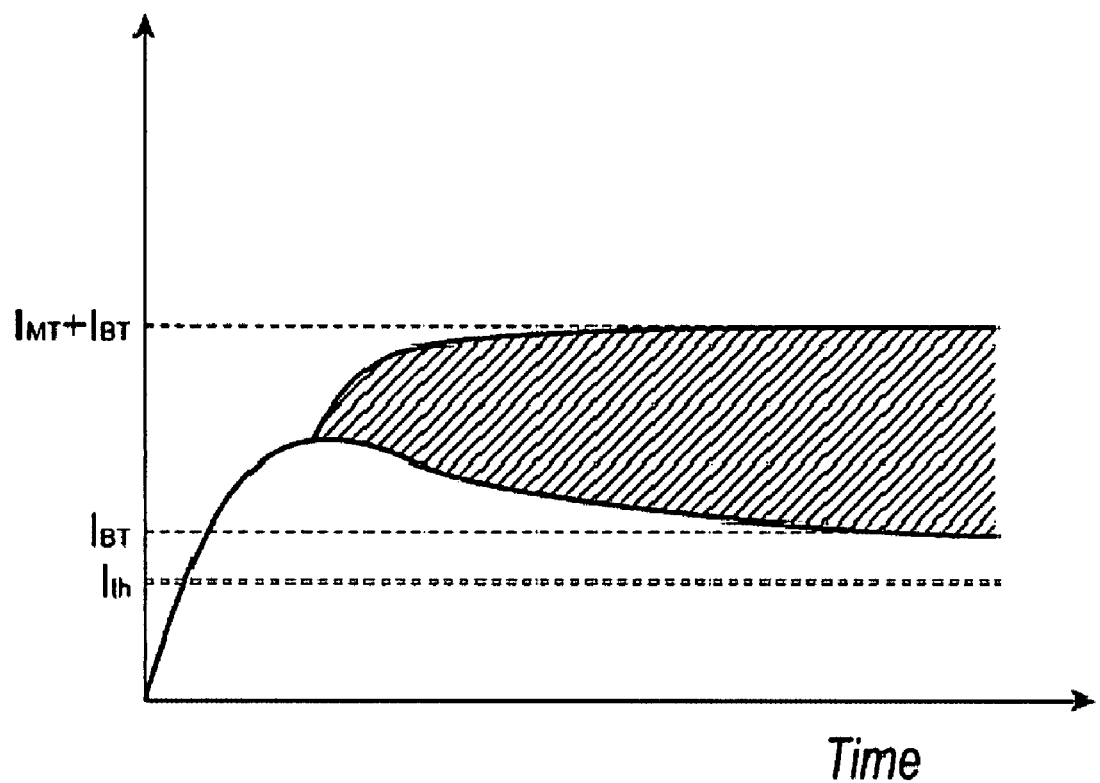
FIG. 4 shows a response of the driving current when the transmitter provides the filter between the driver and the control unit.

The filter 33 inserted between the control unit 25 and the LD-Driver 3 may suppress this overshoot in the driving current for the LD 2 as shown in FIG. 4, which may effectively prevent the optical output from exceeding the specified limit or the value determined from the safety viewpoint for the laser light, or may protect the LD 2 from being broken down by flowing an excess current. The filter 33 may bring the same function in the case where the optical transmitter 1 according to he first embodiment shown in FIG. 1 installs it.

The present invention is not restricted to those exemplarily described embodiments above. For example, the control unit 6 of the transmitter 1 may set the data as follows: when the measured set of the data {Dm, Db} (i=1, . . . , n) has an interval in the data Db greater than the preset value $\Delta Sb$, the other set of the data Dm may be calculated by using the interpolation of the sparse data Db. Specifically, when the exact data Db, just corresponding to the value Dbmin+(i−1)×$\Delta Sb$, is between one of the measured data Db (k) and the other measured data Db (k+1), the current controller 6 may set the desired data Dm by reading the related data Dm (k), Dm (k+1) and so on, for the modulation current to interpolate these read out data to obtain the desired data Dm corresponding to the target data Db. Thus, the LD 2 may be further precisely controlled in the magnitude and the extinction ratio of the output thereof.

Moreover, the memory, 9 or 29, stores the set of data Dm for the modulation current in connection with the bias current Db or the monitored bias current Dbmon. However, the memory, 9 or 29, may hold the set of the data Db for the bias current in connection with the modulation current. In this case, the current controller, 6 or 30, reads the data Db based on the data Dm for the modulation current, or the monitored data Dmmon of the modulation current Imon, respectively. It is therefore intended in the appended claims to cover such modifications that follow in the true spirit and scope of the invention.

I claim:

1. A method for controlling an optical transmitter that includes a laser diode, a photodiode, a driver, and a control unit, the laser diode outputting an optical signal with a predetermined magnitude and a predetermined extinction ratio by receiving modulation and bias currents, the photodiode generating a monitored signal by receiving a portion of the optical signal, the driver controlling the laser diode, the control unit including a memory and a current controller, the memory storing a set of data for the modulation current in a set of addresses in connection with the bias current, the method comprising steps of:
   (a) monitoring the photocurrent to generate a monitored signal;
   (b) setting a first data for the bias current so as to maintain the monitored signal to be a predetermined level;
   (c) setting a second data for the modulation current by reading out from one of addresses in the memory in connection with the first data for the bias current;
   (d) providing a set of data including the first data and the second data to the driver from the control unit; and
   (e) providing the bias current and the modulation current each determined by the first data and second data, respectively, to the laser diode;
   wherein the optical transmitter further includes a low-pass-filter, and
   wherein the process for providing the set of data from the control unit to the driver is carried out through the low-pass-filter.

2. A method for controlling an optical transmitter that includes a laser diode, a photodiode, a driver, and a control unit, the laser diode outputting an optical signal with a predetermined magnitude and a predetermined extinction ratio by receiving modulation and bias currents, the photodiode generating a monitored signal by receiving a portion of the optical signal, the driver controlling the laser diode, the control unit including a memory and a current controller, the memory storing a set of data for the modulation current in a set of addresses in connection with the bias current, the method comprising steps of:
   (a) monitoring the photocurrent to generate a monitored signal;
   (b) setting a first data for the bias current so as to maintain the monitored signal to be a predetermined level;
   (c) setting a second data for the modulation current by reading out from one of addresses in the memory in connection with the first data for the bias current;
   (d) providing a set of data including the first data and the second data to the driver from the control unit; and
   (e) providing the bias current and the modulation current each determined by the first data and second data, respectively, to the laser diode;
   wherein the addresses of the memory correspond to the bias currents from a minimum to a maximum divided by a predetermined interval, and
   wherein the process for setting the first data for the bias current and the process for setting the second data for the modulation current are performed by selecting one of addresses whose corresponding bias current is closest to a current to maintain the monitored signal constant, and by reading a data stored in the selected address of the memory.

3. A method for controlling an optical transmitter that includes a laser diode, a photodiode, a driver, and a control unit, the laser diode outputting an optical signal with a predetermined magnitude and a predetermined extinction ratio by receiving modulation and bias currents, the photodiode generating a monitored signal by receiving a portion of the optical signal, the driver controlling the laser diode, the control unit including a memory and a current controller, the memory storing a set of data for the modulation current in a set of addresses in connection with the bias current, the method comprising steps of:
   (a) monitoring the photocurrent to generate a monitored signal;
   (b) setting a first data for the bias current so as to maintain the monitored signal to be a predetermined level;
   (c) setting a second data for the modulation current by reading out from one of addresses in the memory in connection with the first data for the bias current;
   (d) providing a set of data including the first data and the second data to the driver from the control unit; and
   (e) providing the bias current and the modulation current each determined by the first data and second data, respectively, to the laser diode;
   wherein the addresses of the memory correspond to the bias current from a minimum to a maximum divided by a predetermined interval,
   wherein the process for setting the first data for the bias current is performed by setting the first data so as to maintain the monitored signal constant, and
   wherein the process for setting the second data for the modulation current is performed by reading a plurality of data from addresses of the memory and by interpolating the read data.

* * * * *